(12) United States Patent
Nishimura

(10) Patent No.: US 7,477,357 B2
(45) Date of Patent: Jan. 13, 2009

(54) EXPOSURE APPARATUS AND DEVICE MANUFACTURING METHOD

(75) Inventor: Shinji Nishimura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/956,204

(22) Filed: Dec. 13, 2007

(65) Prior Publication Data

US 2008/0143991 A1    Jun. 19, 2008

(30) Foreign Application Priority Data

Dec. 19, 2006    (JP) .............................. 2006-341108

(51) Int. Cl.
*G03B 27/72*    (2006.01)
*G03B 27/42*    (2006.01)

(52) U.S. Cl. .......................................... 355/71; 355/53

(58) Field of Classification Search ................... 355/53, 355/55, 67–71; 250/548; 356/399–401
See application file for complete search history.

(56) References Cited

U.S. PATENT DOCUMENTS

| 5,895,737 | A | 4/1999 | McCullogh |
| 5,966,202 | A | 10/1999 | McCullogh |
| 6,013,401 | A | 1/2000 | McCullogh |
| 6,078,381 | A * | 6/2000 | Suzuki ......................... 355/53 |
| 6,097,474 | A | 8/2000 | McCullogh |
| 6,462,807 | B1 * | 10/2002 | Nishi .......................... 355/53 |
| 6,876,437 | B2 * | 4/2005 | Kawahara .................... 355/67 |

FOREIGN PATENT DOCUMENTS

| JP | 10-340854 A | 12/1998 |
| JP | 2002-033272 A | 1/2002 |
| JP | 2005-167232 A | 6/2005 |

\* cited by examiner

*Primary Examiner*—Hung Henry Nguyen
(74) *Attorney, Agent, or Firm*—Canon U.S.A., Inc. I.P. Division

(57) ABSTRACT

A scan exposure apparatus includes first and second light-shielding plates arranged within an illumination optical system for illuminating an original, the plates defining a region of the original to be illuminated in a direction of the scan. The scan exposure apparatus further includes a rotation mechanism that rotates at least one of the first and second light-shielding plates in a plane perpendicular to an optical axis of the illumination optical system so as to adjust distribution of widths in a direction perpendicular to the direction of the scan, each of the widths being a width of the region in the direction of the scan.

10 Claims, 4 Drawing Sheets

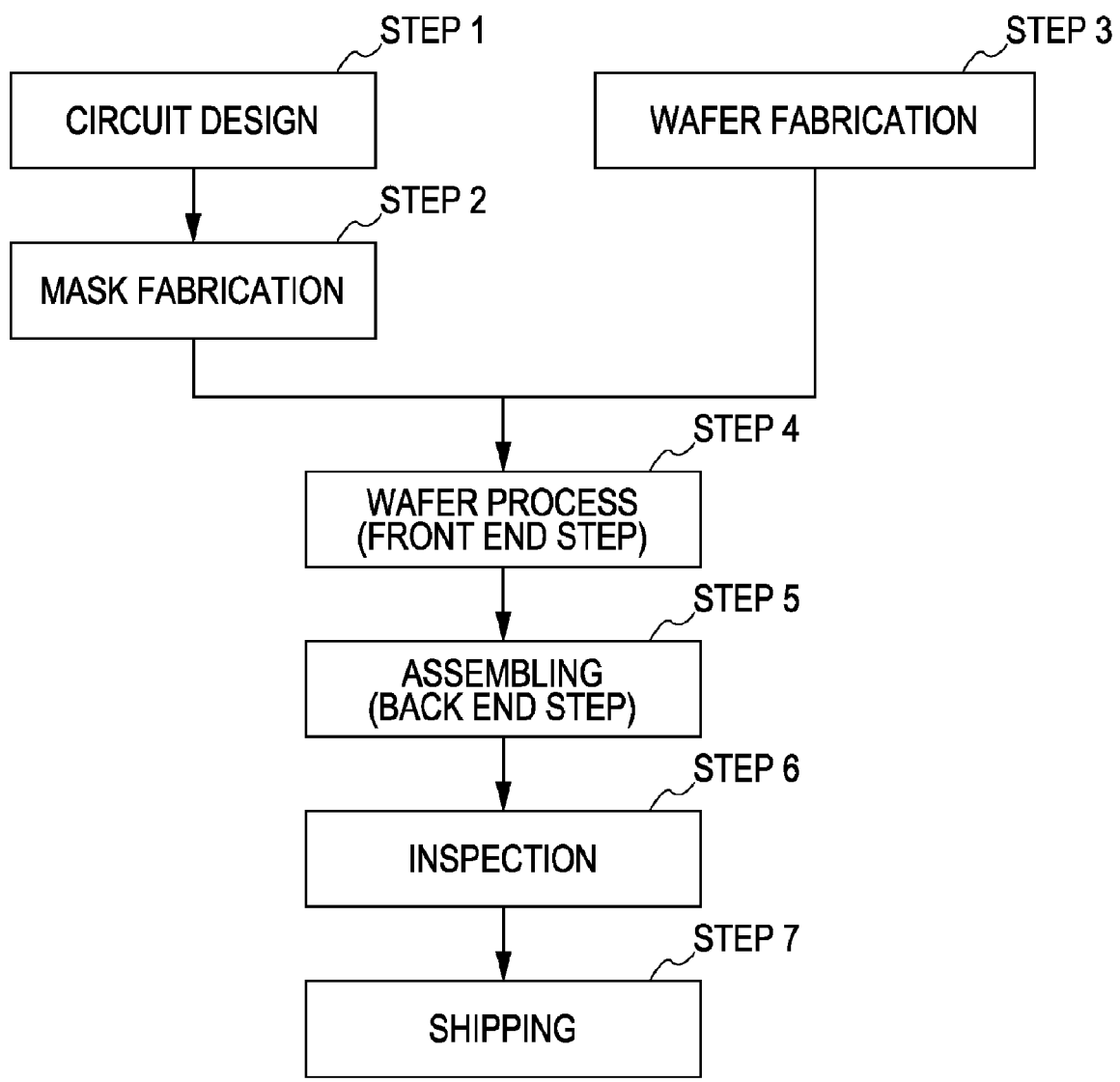

EXPOSURE APPARATUS AND DEVICE MANUFACTURING METHOD

BACKGROUND OF THE INVENTION

1. Field of the Invention

The present invention relates to an exposure apparatus that includes an illumination optical system for illuminating an original and a projection optical system for projecting light from the original onto a substrate, and exposes the substrate to light through the original and the projection optical system while the original and the substrate are being scanned in a direction perpendicular to an optical axis of the projection optical system.

2. Description of the Related Art

For manufacturing semiconductor devices, such as a semiconductor memory formed of an extremely fine pattern, using a photo-lithography technique, a circuit pattern depicted on a reticle is projected on a wafer by a reduction projection optical system to form the circuit pattern. By the demand for further miniaturizing the pattern of the semiconductor device, the exposure apparatus has been responded to the miniaturizing simultaneously with the development of a resist process. A means for improving resolution of the exposure apparatus includes a method for increasing the numerical aperture (NA) of the projection optical system and a method for reducing the exposure wavelength.

As a method for increasing the numerical aperture (NA) of the projection optical system, the liquid immersion has been recently developed for approaches toward the higher NA. It is generally known that the resolving power is proportional to the wavelength of exposure light and is inversely proportional to the NA. The minimal resolution of transferring by a reduction projection exposure apparatus is also proportional to the wavelength of exposure light, and the resolution increases with decreasing wavelength. Hence, along with needs for miniaturization of semiconductor devices, ArF excimer laser with an oscillation wavelength of about 193 nm has recently been in the mainstream instead of KrF excimer laser with a wavelength of 248 nm, and the development of EUV (extreme ultraviolet radiation) with a further shorter wavelength has been in progress.

One reason for reduction in resolution includes every linewidth error that firstly includes the lengthwise/crosswise linewidth error. For correcting the error, an HV (high voltage) correction filter may be used. Then, for correcting the linewidth error every shot, the linewidth error every shot is reduced by controlling the fundamental pulse number of laser for every shot, i.e., the exposure light quantity. The linewidth error in a scanning direction within a shot is reduced by controlling the pulse number of laser within a shot.

For the linewidth error in a non-scanning direction within a shot, filters with different densities are arranged on either side of the optical axis, respectively, in the vicinity of a primary image plane so as to inside direct the lower density portion. Then, by driving the filters in directions opposite to each other so as to change the light quantity in the center and the vicinity of transmitting rays, the exposure light quantity is corrected (see Japanese Patent Laid-Open No. 2002-033272, for example).

In the conventional above-example, for the linewidth error in the non-scanning direction within a shot, the filters with different densities are arranged on either side of the optical axis, respectively, in the vicinity of a primary image plane so as to inside direct the lower density portion. Then, by driving the filters in directions opposite to each other so as to change the light quantity in the center and the vicinity of the transmitting rays, the exposure light quantity is corrected. However, because the optical filter is used, the transmitting light quantity is reduced by about 10%. In the vicinity of the primary image plane, a travel masking blade mechanism and a slit-shape correction mechanism are arranged for scanning exposure. Therefore, in practice, an intermediate imaging plane must be further arranged in optical conjugation with this plane so as to therefore correct the exposure light quantity. Thus, there has been a weak point that the light path length of the illumination optical system is increased to also increase the number of optical devices.

SUMMARY OF THE INVENTION

The present invention provides, for example, a novel technique for adjusting the distribution of dose of light to a substrate.

In an exposure apparatus that has an illumination optical system for illuminating an original and a projection optical system for projecting light from the original onto a substrate, and exposes the substrate to light via the original and the projection optical system while the original and the substrate are being scanned in a direction perpendicular to an optical axis of the projection optical system, the exposure apparatus according to an aspect of the present invention includes first and second light-shielding plates arranged within the illumination optical system and configured to define a region of the original to be illuminated in a direction of the scan; and rotation mechanism configured to rotate at least one of the first and second light-shielding plates in a plane perpendicular to the optical axis of the illumination optical system so as to adjust distribution of widths in a direction perpendicular to the direction of the scan, each of the widths being a width of the region in the direction of the scan.

In a method of manufacturing a device, the method according to another aspect of the present invention includes exposing a substrate to light using the exposure apparatus described above; developing the exposed substrate; and processing the developed substrate to manufacture the device.

Other aspects and advantages besides those discussed above shall be apparent to those skilled in the art from the description of embodiments of the invention which follows. In the description, reference is made to accompanying drawings, which form apart thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 6 is a flowchart of a device manufacturing process.

DESCRIPTION OF THE EMBODIMENTS

Figure 1:
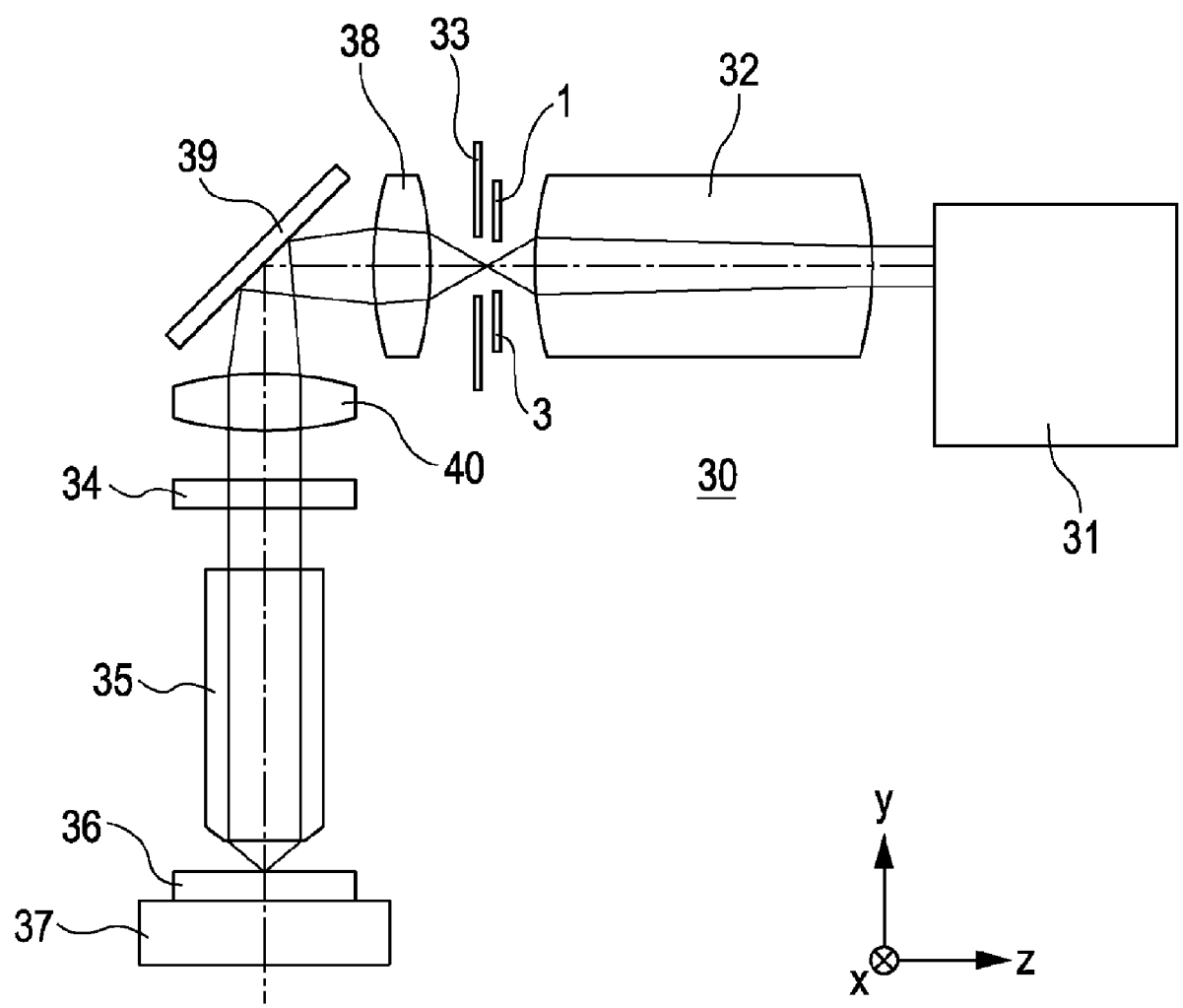
FIG. 1 is a structural drawing of an exposure apparatus according to an embodiment of the present invention, illustrating the positional relationship between a CD (critical dimension) correction slit and a masking blade.

In exemplary embodiments of the present invention, the present invention is incorporated in a scanning exposure apparatus. The scanning exposure apparatus includes an illumination optical system for illuminating a reticle (original) and a projection optical system for projecting light from the reticle on a wafer (substrate). Then, the wafer is exposed to the light through the reticle and the projection optical system while the reticle and the wafer are being scanned. The apparatus according to the embodiment further includes first and second light-shielding plates and a rotating mechanism of the light-shielding plates. The first and second light-shielding plates are arranged within the illumination optical system so as to define a region of the reticle to be illuminated in a scanning direction. The rotating mechanism rotates at least one of the first and second light-shielding plates on a plane perpendicular to the optical axis of the illumination optical system for adjusting the distribution of widths, in the scanning direction, of the region in a direction perpendicular to the scanning direction.

The configuration described above exhibits an effect that the reduction in transmitting light quantity can be further suppressed in comparison with a method in that two filters with different densities are arranged on either side of the optical axis, respectively, in the vicinity of a primary image plane and by driving the filters in directions opposite to each other, the light quantity in the center and the vicinity of the transmitting rays is changed. Since a non-scanning direction exposure light quantity correction (CD (critical dimension) correction) slit can be smaller formed in size and weight, it can be easily arranged in the vicinity of the primary image plane. Namely, without an additional optically conjugate intermediate imaging plane, uniform exposure conditions can be obtained as well as the high speed driving can be achieved with low electrical power consumption.

It is preferable that the rotating mechanism rotate the first and second light-shielding plates on a plane perpendicular to the optical axis of the illumination optical system symmetrically with respect to a reference line in a direction perpendicular to the scanning direction. Thereby, the driving distance of the shielding plate for the CD correction can be minimized.

According to the embodiment, the first or second light-shielding plate corresponds to a first slit mechanism constituted of a first slit. According to the embodiment, the rotational center of the rotating mechanism is located at a position set apart in the scanning direction from the optical axis of the illumination optical system.

The scanning exposure apparatus includes a first masking blade and a second masking blade (second slit mechanism), which are for illuminating an original with slit exposing light. The second slit mechanism is constituted of a second slit. It is preferable that the center of the first slit be substantially aligned with that of the second slit. Edges of the first and second light-shielding plates have shapes corresponding to those of the first and second masking blades, respectively. It is preferable that the edge shape of at least one of the first and second light-shielding plates be variable.

Embodiments

Embodiments of the present invention will be described below with reference to the drawings. FIG. 1 shows the configuration of an exposure apparatus according to an embodiment of the present invention. The apparatus of FIG. 1 includes a light-shielding slit (first slit) formed separately from a light-shielding slit (second slit) for processing the exposure light for illuminating a reticle (original) to be a slit shape. The first slit is formed of first and second slit-material plates (light-shielding plates) for restricting the region of the reticle to be illuminated in the scanning direction. When correcting the exposure light quantity in a direction perpendicular to the scanning direction (non-scanning direction), at least one of the front edge of the additional light-shielding slit (light-shielding edge of the first light-shielding plate) and the rear edge (light-shielding edge of the second light-shielding plate) is rotated. Thereby, slit widths, i.e., the transmitting light quantities, are made different for the left and right of the scanning direction. Also, the first and second light-shielding plates are arranged in the vicinity of the primary image plane.

Referring to FIG. 1, a laser pulse generating device 31 generates laser pulses, which are exposure light, and an optical system 32 is for processing the exposure light generated by the laser pulse generating device 31 to be desired exposure light. The laser pulse generating device 31, the optical system 32, a mirror 39, and a relay lens 40 constitute an illumination optical system 30. A masking blade (second slit mechanism) 33 is arranged in the vicinity of the primary image plane of the illumination optical system 30 for scanning with the exposure light simultaneously with the scanning of a wafer stage 37.

A reticle 34 has a pattern depicted thereon, which is an original for printing its pattern on the wafer 36, and a projection optical system 35 is for reduction exposing the wafer 36 with the pattern of the reticle 34. A masking blade 33 builds a slit (second slit) for processing exposure light for illuminating the reticle 34 to be a slit shape. The wafer 36 is a photosensitive substrate, and a wafer stage 37 is for scanning the wafer 36 for exposure by holding it with attraction. Reference numerals 1 and 3 denote a CD correction drive slit member (first light-shielding plate) constituting a non-scanning direction exposure light quantity correction device, which is a feature of the present invention, and a CD correction non-drive slit member (second light-shielding plate), respectively. The CD correction drive slit member 1 and the CD correction non-drive slit member 3 constitute a first slit mechanism. The first slit mechanism is also arranged in the vicinity of the intermediate imaging plane in the same way as in the masking blade 33.

Figure 2:
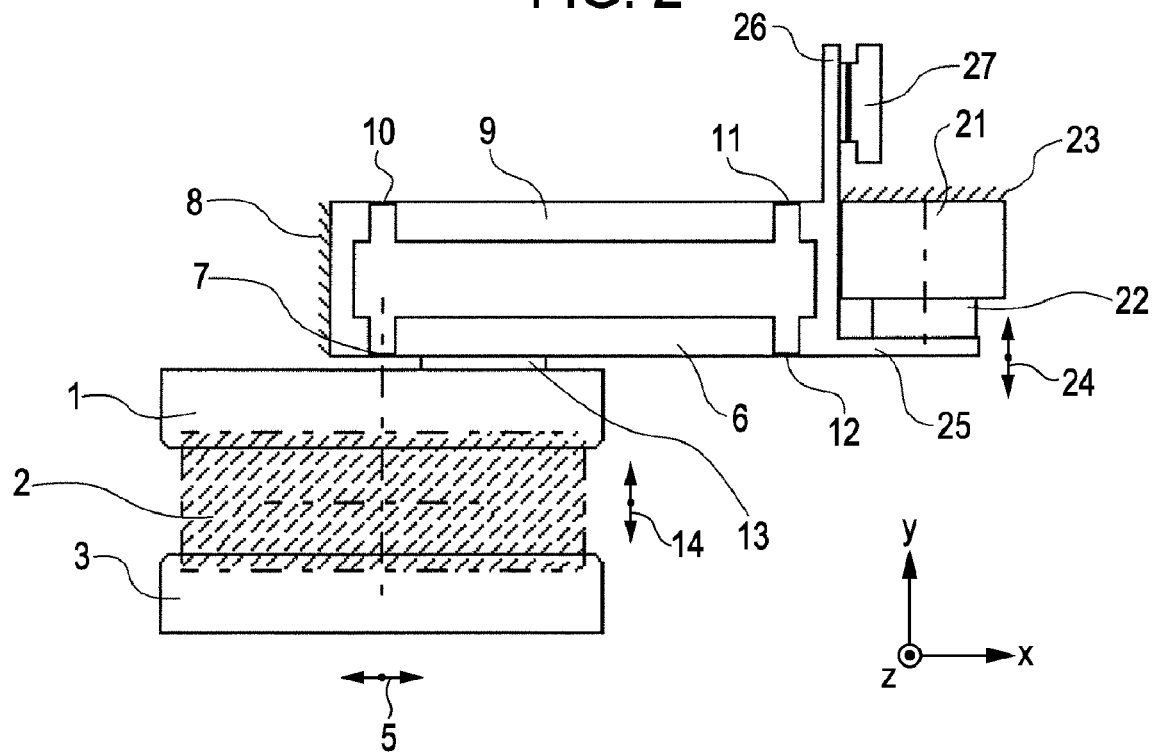
FIG. 2 is an explanatory view for illustrating a non-scanning direction exposure light-quality correction device arranged in the vicinity of a primary image plane in an illumination system of the exposure apparatus of FIG. 1.

FIG. 2 shows the configuration of the non-scanning direction exposure light quantity correction device (CD correction device) in the exposure apparatus of FIG. 1. Referring to FIG. 2, reference numeral 1 denotes a CD correction drive slit member 1 for controlling the exposure light quantity; numeral 2 an effective light region of exposure light transmitting in the vicinity of the intermediate imaging plane; and numeral 3 a CD correction non-drive slit member for correcting the exposure light quantity in the non-scanning direction in cooperation with the CD correction drive slit member 1. The CD correction drive slit member 1 and the CD correction non-drive slit member 3 have end portions (light-shielding edges) arranged at positions in a direction perpendicular to the scanning direction as reference points, respectively.

Between these end portions, a CD correction slit (first slit) is formed for correcting the exposure light quantity. The CD correction drive slit member 1 and the CD correction non-drive slit member 3 are arranged in the vicinity of the intermediate imaging plane of the illumination optical system 30 so that the center of the first slit is positioned in the vicinity of the center of the second slit.

Reference numeral 4 denotes a scanning direction capable of correcting laser pulses on the exposure plane; numeral 6 a drive link mechanism for holding the CD correction drive slit member 1; numeral 7 a rotational drive fulcrum rotatable the drive link mechanism 6 in only one direction; numeral 8 a drive link fixing unit for holding the entire link parts; numeral 9 a drive link mechanism moving in parallel with the drive link mechanism 6; numerals 10 to 12 link hinges constituting the drive link mechanism; and numeral 13 a CD correction drive slit support unit connecting the CD correction drive slit member 1 to the drive link mechanism 6.

Reference numeral 21 denotes a motor non-drive unit of a linearly-driven motor; numeral 22 a motor drive unit of the linearly-driven motor; numeral 23 a motor fixing unit for holding the entire motor parts; numeral 24 a motor driving direction of a motor driving the link mechanism; numeral 25 a motor drive unit support member connected to the drive link mechanism 6; numeral 26 a position detection sensor displacement part connected to the link mechanism for displacing in the Z direction; and numeral 27 a position detection sensor reading part for reading the displacement of the position detection sensor displacement part 26.

Figure 3:
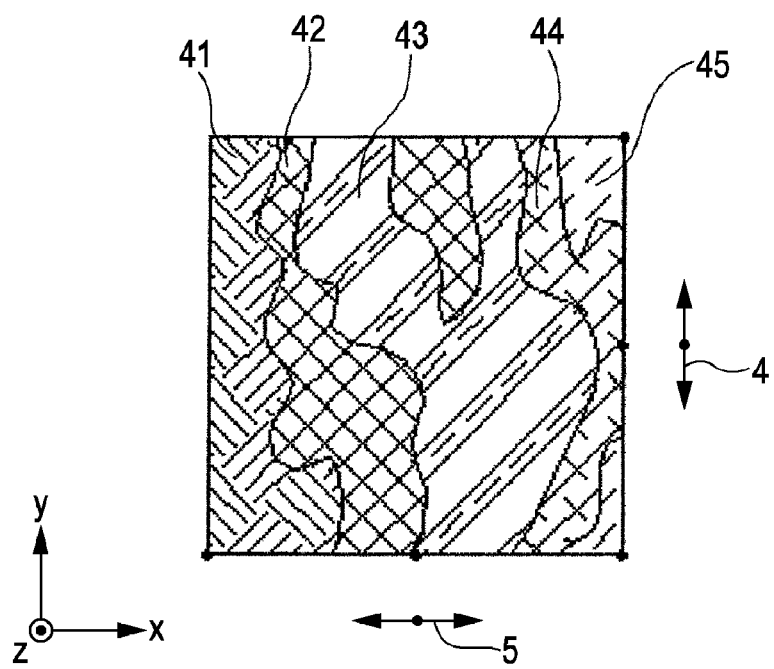
FIG. 3 is a drawing showing the illuminance non-uniformity on a wafer surface in a state before driving the non-scanning direction exposure light-quality correction device of FIG. 2.

FIG. 3 is a drawing showing the illuminance non-uniformity on a wafer surface in a state before driving a non-scanning direction exposure light-quality correction device according to the embodiment. In the drawing, reference numeral 41 denotes a highest part of the exposure illuminance on the wafer surface; numeral 42 a middle high part of the exposure illuminance on the wafer surface; numeral 43 an intermediate part of the exposure illuminance on the wafer surface; numeral 44 a middle low part of the exposure illuminance on the wafer surface; and numeral 45 a lowest part of the exposure illuminance on the wafer surface.

Figure 4:
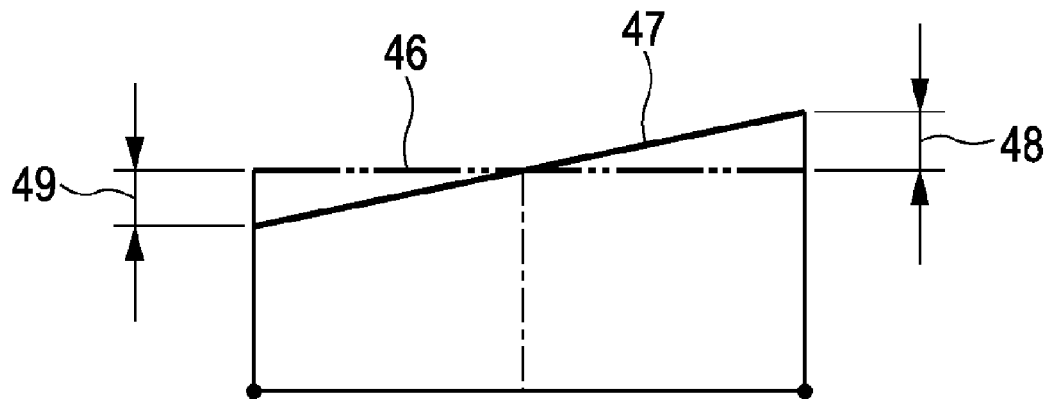
FIG. 4 is a drawing showing an exposure light correction amount in the non-scanning direction corrected by the non-scanning direction exposure light-quality correction device of FIG. 2.

FIG. 4 is a drawing showing an exposure light correction amount in the non-scanning direction according to the embodiment. In the drawing, reference numeral 46 denotes the exposure light level when the CD correction drive slit member 1 is located in the intermediate position (position in parallel with the CD correction non-drive slit member 3), that is, the non-correction level without the CD correction. Reference numeral 47 denotes a primary correction level when the CD correction drive slit member 1 is driven from the intermediate position to have the CD correction; numeral 48 a state of the correction quantity corrected on the plus side from the primary correction level 47; and numeral 49 a state of the correction quantity corrected on the minus side from the primary correction level 47.

[Operation Description]

Figure 5:
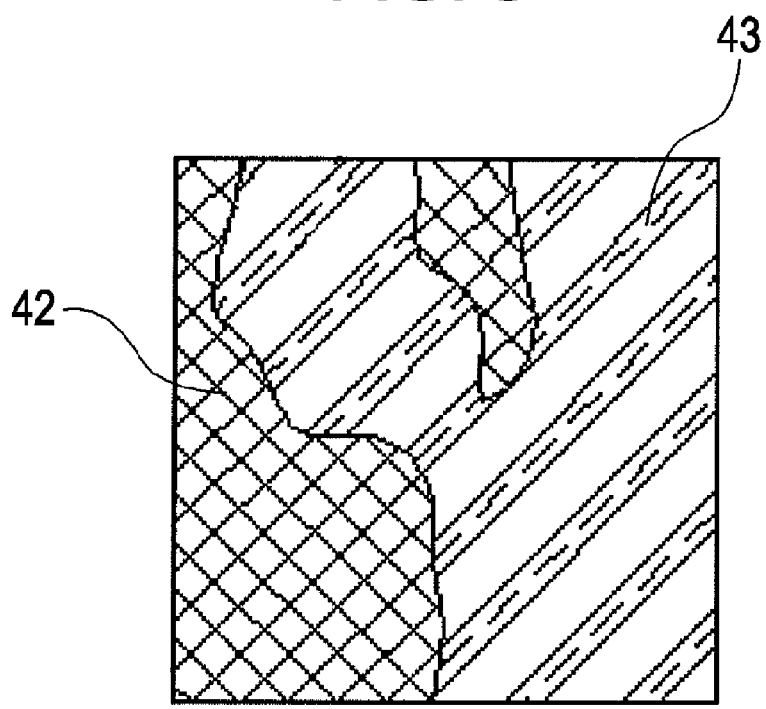
FIG. 5 is a drawing showing the illuminance non-uniformity on the wafer surface in a state after driving the non-scanning direction exposure light-quality correction device of FIG. 2 so as to correct the exposure light-quality in the non-scanning direction.

FIG. 5 is a drawing showing the illuminance non-uniformity on the wafer surface after driving the non-scanning direction exposure light-quality correction device according to the embodiment. Since the illuminance non-uniformity on the wafer surface due to process factors during the exposing the wafer (uneven resist application, uneven development, uneven etching, etc.) is different every shot, the CD correction every shot is needed. Then, the illuminance non-uniformity distribution of one shot on the wafer surface before correction shown in FIG. 3 is measured in a range from the highest part 41 of the exposure illuminance to the lowest part 45 of the exposure illuminance.

Then, for uniforming the illuminance non-uniformity distribution of one shot, the value having primary inclination is established based on measured results of the exposure correction quantity in the non-scanning direction as follows: (1) When the measured illuminance non-uniformity is a symmetrical shot, the value is set in the non-correction level 46 (FIG. 4) without the CD correction at the intermediate position; and (2) When the shot is the measured illuminance non-uniformity divided into the higher and the lower from substantially the center, the higher measured value side is on a condition of the correction quantity corrected on the minus side, so that the value is set at the primary correction level 47 (FIG. 4) capable of CD correcting. Subsequently, the CD correction drive slit member 1 is driven so as to perform the CD correction on the established correction values.

Since the item (1) is in the non-correction level 46 without the CD correction, the CD correction drive slit member 1 need not be inclined, so that the wafer is normally exposed. First, laser pulses, which are exposure light, are generated in the laser pulse generating device 31 so as to enter the optical system 32 for processing light to be desired exposure light. Subsequently, the exposure light passes through the space (first slit) between the CD correction drive slit member 1 and the CD correction non-drive slit member 3, which are arranged in the vicinity of the intermediate imaging plane. Furthermore, the exposure light passes through the masking blade 33 (second slit) so as to be irradiated on the reticle 34. A pattern depicted on the reticle 34 is reduction-exposed on the wafer 36 by the projection optical system 35 so that the pattern is printed on the wafer surface.

Since the item (2) is in the primary correction level 47 capable of CD correcting, the CD correction drive slit member 1 is inclined. Namely, for parallelizing the effective light region 2 of the exposure light in the vicinity of the intermediate imaging plane of the illumination optical system 30 with the primary correction level 47, the following operations are performed before exposure of the shot (between shots). In order to incline the CD correction drive slit member 1 so that the primary correction level 47 for the measured value becomes the set value, first, the drive instruction is issued to a linear motor supported to the motor fixing unit 23. Thereby, the motor drive unit 22 upward moves in the motor driving direction 24 and the motor drive unit support member 25 is upward raised. At this time, the position detection sensor displacement part 26 fixed to the motor drive unit support member 25 is also raised. The displacement of the position detection sensor displacement part 26 is read by the position detection sensor reading part 27 and is fed back to stop at the instructed position.

A linear motor generally requires a translation guide. However, according to the embodiment, the link mechanism is constituted of the drive link mechanism 6, the link hinge 12, and the motor drive unit support member 25. Accordingly, since the linear motor is fixed to the motor drive unit support member 25 moving in parallel with the drive link fixing unit 8, without the additional translation guide, the linear motor can always maintain a parallel movement state. When the linear motor is driven to have a predetermined position, the link mechanism connected to the motor drive unit support member 25 is inclined about the fulcrum 7 so that the CD correction drive slit member 1 is inclined via the member 13 connected to the drive link mechanism 6. Due to the inclination, the exposure light transmitting between the CD correction drive slit member 1 and the CD correction non-drive slit member 3 has a primary illuminance distribution in that light quantities are different on both sides of the scanning direction. By this function, the exposure light arriving on the wafer surface has the distribution in that the highest part (41 in FIG. 3) becomes the intermediate part 43 of the exposure illuminance while the lowest part (45 in FIG. 3) becomes the middle high part 42 of the exposure illuminance shown in FIG. 5, having a tendency of uniformed illuminance distribution on the surface.

Then, in the same way as in item (1), laser pulses, which are exposure light, are generated in the laser pulse generating device 31 so as to enter the optical system 32 for processing the exposure light to be desired one. Consequently, the exposure light arrives at the space (first slit) between the CD correction drive slit member 1 and the CD correction non-drive slit member 3, which are arranged in the vicinity of the intermediate imaging plane. Hereupon, the exposure light quantity in the non-scanning direction is corrected in accordance with the inclination of the CD correction drive slit member 1. For example, the dose distribution shown in FIG. 3 is corrected to that shown in FIG. 5.

As described above, according to the embodiment, the reduction in transmitting light quantity can be suppressed much smaller than the conventional example to be about 2.5% or less. Also, since the CD correction slit can be made smaller in size and weight, it can be easily arranged in the vicinity of the primary image plane. That is, without an optically conjugate additional intermediate imaging plane, exposure conditions can be uniformed. The speeding up and reduction in electric power can also be achieved in driving.

In the above-description, the light-shielding edge of the exposure light-quantity correction slit (slit members 1 and 3) is linear; however, when the shape of the exposure slit in the masking blade 33 is non-linear, such as arc-shaped, it is preferable that the light-shielding edge of the exposure light-quantity correction slit be also shaped in the same way. It also is more preferable that the light-shielding edge be variably formed in a desired shape. In FIG. 2, a case is shown in that only one of the exposure light-quantity correction slit members 1 and 3 is rotated; alternatively, both of them may also be rotated symmetrically with respect to a reference line perpendicular to the scanning direction. Furthermore, when the light shielding edge of the exposure light-quantity correction slit is intersected with that of the exposure light slit, complicated exposure light-quantity correction more than that in FIG. 4, such as polygonal line-shaped, can also be performed.

Embodiment of Micro Device Manufacturing

Then, the manufacturing process of micro devices (semiconductor chips, such as an IC and an LSI, a liquid crystal panel, a CCD (charge-coupled device), a thin film magnetic head, a micro-machine, etc.) using this exposure apparatus will be described. FIG. 6 shows the flow of a semiconductor device manufacturing process. At Step 1 (circuit design), the circuit of the semiconductor device is designed. At Step 2 (mask fabrication), a mask having a designed pattern formed thereon (referred to also as an original or reticle) is fabricated. On the other hand, at Step 3 (wafer fabrication), a wafer (referred to also as a substrate) is fabricated using a material such as silicon. At Step 4 (wafer process), which is called a front end process, using the exposure apparatus having the prepared mask mounted thereon and the prepared wafer, a practical circuit is formed on the wafer by a lithographic technique. At next Step 5 (assembling), which is called a back end process, semiconductor chips are formed using the wafer fabricated at Step 4. The back end process includes an assembly process (dicing and bonding) and a packaging process (chip inclusion). At Step 6 (inspection), the inspections of the semiconductor devices manufactured at Step 5, such as an operation checking test and a durability test, are executed. Thereby, the semiconductor devices are accomplished through such Steps and they are shipped at Step 7.

The wafer process at Step 4 includes an oxidation step for oxidizing the wafer surface, a CVD (chemical vapor deposition) step for forming an insulation film on the wafer surface, and an electrode forming step for forming an electrode on the wafer surface by evaporation. The wafer process also includes an ion implantation step for implanting ions in the wafer, a resist processing step for applying a photo-sensitive material on the wafer, and an exposure step for exposing the wafer via the mask having the circuit pattern formed thereon after the resist processing step, using the exposure apparatus. The wafer process further includes a developing step for developing the wafer exposed at the exposure step, an etching step for removing parts other than the resist images developed at the developing step, and a resist stripping step for removing unnecessary resist after the etching. By the repetition of these steps, multiple circuit patterns are formed on the wafer.

According to the embodiments of the present invention described above, a novel technique, such as an adjusting technique for adjusting dose distribution of the substrate, can be provided.

While the present invention has been described with reference to exemplary embodiments, it is to be understood that the invention is not limited to the disclosed exemplary embodiments. The scope of the following claims is to be accorded the broadest interpretation so as to encompass all corrections, equivalent structures and functions.

This application claims priority from Japanese Patent Application No. 2006-341108, entitled "EXPOSURE APPARATUS AND DEVICE MANUFACTURING METHOD" and filed on Dec. 19, 2006, the entire contents of which are incorporated herein by reference.

What is claimed is:

1. An exposure apparatus that has an illumination optical system for illuminating an original and a projection optical system for projecting a pattern on the original onto a substrate, the exposure apparatus configured to expose the substrate while the original and the substrate are being scanned, the exposure apparatus comprising:

first and second light-shielding plates arranged opposite each other with illumination light therebetween and configured to define a region of the original to be illuminated; and a link mechanism for holding at least one of the first and second light-shielding plates, the link mechanism including a fixing member, a driven member and a holding member having one end connected to the fixing member and another end connected to the driven member, wherein the link mechanism is configured to rotate the at least one first and second light-shielding plates held by the link mechanism.

2. An exposure apparatus according to claim 1, wherein a plurality of shots are exposed on the substrate, and wherein the link mechanism rotates the at least one first and second light-shielding plates held by the link mechanism based on process factors of the substrate.

3. An exposure apparatus according to claim 1, wherein a plurality of shots are exposed on the substrate, and wherein the link mechanism rotates the at least one first and second light-shielding plates held by the link mechanism between the shots.

4. An exposure apparatus according to claim 1, wherein the link mechanism rotates the at least one first and second light-shielding plates held by the link mechanism so as to adjust a line width in a non-scanning direction.

5. An exposure apparatus according to claim 1, wherein the link mechanism rotates the at least one first and second light-shielding plates held by the link mechanism so that the first and second light-shielding plates are symmetrical with respect to a reference line perpendicular to a scanning direction.

6. An exposure apparatus according to claim 1, wherein a rotational center of the link mechanism is located at a position spaced from an optical axis of the illumination light.

7. An exposure apparatus according to claim 1, further comprising first and second masking blades configured to be moved in accordance with scanning of the original and the substrate.

8. An exposure apparatus according to claim 7, wherein edges of the first and second light-shielding plates have shapes respectively corresponding to those of the first and second masking blades.

9. An exposure apparatus according to claim 1, wherein an edge of the at least one first and second light-shielding plates is variable in shape.

10. A method of manufacturing a device utilizing an exposure apparatus that has an illumination optical system for illuminating an original and a projection optical system for projecting a pattern on the original onto a substrate, the exposure apparatus configured to expose the substrate while the original and the substrate are being scanned, the exposure apparatus including first and second light-shielding plates arranged opposite each other with illumination light therebetween and configured to define a region of the original to be illuminated; and a link mechanism for holding at least one of the first and second light-shielding plates, the link mechanism including a fixing member, a driven member and a holding member having one end connected to the fixing member and another end connected to the driven member, wherein the link mechanism is configured to rotate the at least one first and second light-shielding plates held by the link mechanism, the method comprising:

exposing the substrate using the exposure apparatus; and developing the substrate.

* * * * *